(12) United States Patent
Miyagawa et al.

(10) Patent No.: US 7,888,809 B2
(45) Date of Patent: Feb. 15, 2011

(54) SEMICONDUCTOR DEVICE AND METHOD OF MANUFACTURING THE SAME

(75) Inventors: Yuichi Miyagawa, Kanagawa (JP); Takamitsu Noda, Kanagawa (JP); Hiroyasu Miyamoto, Kanagawa (JP); Jun Tsukano, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/588,643

(22) Filed: Oct. 22, 2009

(65) Prior Publication Data

US 2010/0102461 A1    Apr. 29, 2010

(30) Foreign Application Priority Data

Oct. 28, 2008   (JP) .............................. 2008-277271

(51) Int. Cl.
*H01L 23/29* (2006.01)
(52) U.S. Cl. ...................................... 257/790; 257/787
(58) Field of Classification Search ................. 257/790, 257/787
See application file for complete search history.

(56) References Cited

U.S. PATENT DOCUMENTS

| | | | | |
|---|---|---|---|---|
| 5,379,186 A * | 1/1995 | Gold et al. | ................... | 361/706 |
| 5,998,867 A * | 12/1999 | Jensen et al. | ................. | 257/729 |
| 6,181,017 B1 * | 1/2001 | Hatchard et al. | ............. | 257/797 |
| 6,194,789 B1 * | 2/2001 | Zhou | ........................... | 257/790 |
| 6,756,670 B1 * | 6/2004 | Yamazaki et al. | ........... | 257/729 |
| 7,777,352 B2 * | 8/2010 | Mahler et al. | ................ | 257/784 |
| 2002/0020923 A1 * | 2/2002 | Kanatake | ..................... | 257/778 |

FOREIGN PATENT DOCUMENTS

JP    8-162573    6/1996

* cited by examiner

*Primary Examiner*—S. V Clark
(74) *Attorney, Agent, or Firm*—McGinn IP Law Group, PLLC

(57) ABSTRACT

A semiconductor device including a substrate, a semiconductor chip mounted on the substrate, and an encapsulation resin encapsulating the semiconductor chip, wherein the encapsulation resin contains a first resin region composed of a first resin composition, a second resin region composed of a second resin composition, and a mixed layer formed between the first resin region and the second resin region so as to have the first resin composition and the second resin composition mixed therein is provided.

8 Claims, 16 Drawing Sheets

SEMICONDUCTOR DEVICE AND METHOD OF MANUFACTURING THE SAME

This application is based on Japanese patent application No. 2008-277271 the content of which is incorporated hereinto by reference.

BACKGROUND

1. Technical Field

The present invention relates to a semiconductor device and a method of manufacturing the same.

2. Related Art

There are known techniques of mounting a semiconductor element on a substrate, and then encapsulating it using an encapsulation resin to thereby form a semiconductor package. The conventional encapsulation has been carried out using a single species of resin composition. However, under the presence of bonding wires, it is now necessary to prevent the wires from flowing and falling down in the resin, in the process of encapsulating the semiconductor element using the encapsulation resin. On the other hand, it is also necessary to control warping behavior of the semiconductor package after the encapsulation. It has however been difficult to optimize the resin material which satisfies these requirements at the same time, by using only a single species of resin composition. For this reason, a large number of species of resin materials have been prepared and developed aiming at achieving the optimum characteristics, only to raise problems in large cost and poor productivity.

Japanese Laid-Open Patent Publication No. H08-162573 describes a semiconductor device which contains a semiconductor element bonded, while placing an adhesive layer in between, to a substrate having a circuit preliminarily formed thereon, and encapsulated by a cured, resin layer having a layered structure composed of an inner cured resin layer and an outer cured resin layer.

Filler content of the inner cured resin layer herein is set smaller than that of the outer cured resin layer. The publication described that, by virtue of this configuration, the semiconductor device which is successfully suppressed in the flowing of wires and reduced in the warping may be provided. The inner cured resin layer and the outer cured resin layer herein are formed by transfer molding.

SUMMARY

The technique described in Japanese Laid-Open Patent Publication No. H08-162573, however, produces a boundary line between the inner cured resin layer and the outer cured resin layer, both of which being formed by transfer molding. Further, the adhesion between the layers tends to be inhibited and consequently to cause separation between the layers to thereby degrade the quality of the semiconductor device, due to existence of a mold releasing agent and oil components on the surface of the inner cured resin layer.

According to the present invention, there is provided a semiconductor device which includes:

a substrate;

a semiconductor chip mounted over the substrate; and an encapsulation resin encapsulating the semiconductor chip, wherein the encapsulation resin contains a first resin region composed of a first resin composition, a second resin region composed of a second resin composition, and a mixed layer formed between the first resin region and the second resin region so as to have the first resin composition and the second resin composition mixed therein.

According to the present invention, there is provided also a method of manufacturing semiconductor device which includes encapsulating a semiconductor chip mounted over a substrate using a encapsulation resin, wherein in the step of the encapsulating the semiconductor chip, encapsulation is allowed to proceed using a first resin composition and a second resin composition so that the encapsulation resin contains a first resin region composed of the first resin composition, a second resin region composed of the second resin composition, and a mixed layer formed between the first resin region and the second resin region so as to have the first resin composition and the second resin composition mixed therein.

By virtue of these configurations, the semiconductor chip may be encapsulated using the first resin composition and the second resin composition which are selected depending on purposes, and the adhesiveness between the first resin region and the second resin region may be improved, to thereby prevent separation therebetween. As a consequence, the semiconductor device excellent in mass productivity and reliability may be obtained. Also the warping characteristics of the semiconductor device which contains the encapsulation resin may be improved. By altering the ratio of composition of the first resin composition and the second resin composition, the warping behavior may be controlled. Accordingly, a highly-reliable package structure less causative of warping may be obtained, without preparing and developing a large number of species of resin materials in order to optimize the characteristics, unlike the conventional methods.

It is to be understood that also any arbitrary combinations of the constituents described in the above, and also any exchanges of expressions of the present invention among the method, device and so forth, may be effective as embodiments of the present invention.

According to the present invention, the characteristics such as warping behavior of a semiconductor device containing an encapsulation resin may successfully be controlled, and thereby the quality thereof may be improved.

BRIEF DESCRIPTION OF THE DRAWINGS

The above and other objects, advantages and features of the present invention will be more apparent, from the following description of certain preferred embodiments taken in conjunction with the accompanying drawings, in which:

FIGS. 7A and 7B are sectional views illustrating other procedures of manufacturing a semiconductor device by compression molding process in one embodiment of the present invention;

FIGS. 8A and 8B are sectional views illustrating other procedures of manufacturing a semiconductor device by compression molding process in one embodiment of the present invention;

FIGS. 9A and 9B are sectional views illustrating other procedures of manufacturing a semiconductor device by compression molding process in one embodiment of the present invention;

DETAILED DESCRIPTION

The invention will now be described herein with reference to an illustrative embodiment. Those skilled in the art will recognize that many alternative embodiments can be accomplished using the teachings of the present invention and that the invention is not limited to the embodiments illustrated for explanatory purposes.

Embodiments of the present invention will be explained referring to the attached drawings. Note that any similar constituents will be given with similar numerals or symbols in all drawings, and explanations therefor will not be repeated.

Figure 1:
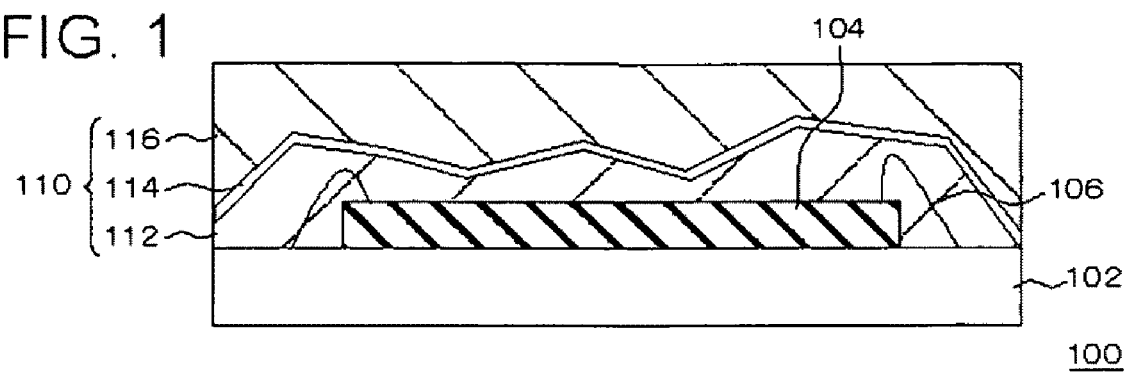
FIG. 1 is a sectional view illustrating an exemplary configuration of a semiconductor device in one embodiment of the present invention.

FIG. 1 is a sectional view illustrating an exemplary semiconductor device 100 of this embodiment.

The semiconductor device 100 includes a substrate 102, a semiconductor chip 104 mounted over the substrate 102, bonding wires 106 electrically connecting the semiconductor chip 104 with the substrate 102, and an encapsulation resin 110 burying the semiconductor chip 104 and the bonding wires 106. The substrate 102 may be a wiring board having an interconnect layer. In this embodiment, the substrate 102 may be a multi-layered wiring board in which a plurality of interconnect layers are connected with each other.

In this embodiment, the encapsulation resin 110 includes a first resin region 112 composed of a first resin composition, a second resin region 116 composed of a second resin composition, and a mixed layer 114 formed between the first resin region 112 and the second resin region 116, and having the first resin composition and the second resin composition mixed therein. Each of the interface between the first resin region 112 and the mixed layer 114, and the interface between the second resin region 116 and the mixed layer 114 have a wavy profile.

Figure 13:
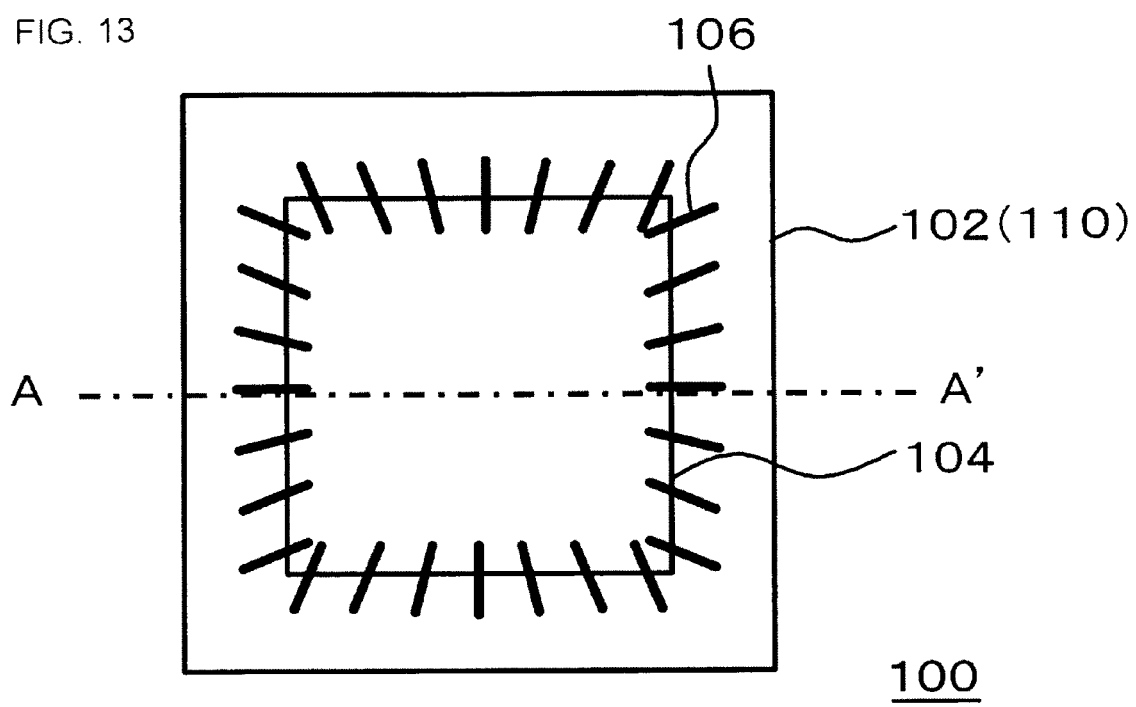
FIG. 13, FIGS. 14A and 14B, FIGS. 15A and 15B, and FIG. 16 are plan views illustrating exemplary configurations of a semiconductor device in the embodiments of the present invention.

In the example illustrated in FIG. 1, the first resin region 112 is formed over the entire surface of the substrate 102, and the second resin region 116 is formed over the first resin region 112. The mixed layer 114 is formed over the entire region between the first resin region 112 and the second resin region 116. The body of the semiconductor chip 104 and the bonding wires 106 are buried in the first resin region 112. FIG. 13 is a plan view of the semiconductor device 100 illustrated in FIG. 1. In the drawing, the individual constituents are simply outlined for easy understanding of the positional relations. FIG. 1 corresponds to a sectional view taken along line A-A' in FIG. 13.

The first resin composition composing the first resin region 112, and the second resin composition composing the second resin region 116 may contain, as source materials, resin which composes a base, curing agent, and filler. The first resin composition and the second resin composition may additionally contain flexibility enhancer, curing accelerator, latent catalyst, mold releasing agent, silicone oil, stress reducing agent, colorant and so forth as source materials. The filler may be silica or alumina filler, for example.

The first resin composition and the second resin composition may differ in fluidity under heating in the process of encapsulation before being cured. The first resin composition and the second resin composition may differ also in curing shrinkage characteristics. The first resin composition and the second resin composition may have different glass transition temperatures (Tg). Difference of the glass transition temperature between the first resin composition and the second resin composition may be adjusted to 5° C. or more, for example.

The first resin composition and the second resin composition may typically differ in filler content (% by weight) relative to the respective total resin composition. By reducing the filler content (% by weight), the resin composition may be improved in fluidity. Difference of the filler content (% by weight) relative to the total resin composition, between the first resin composition and the second resin composition, may be set typically to 1% or more.

The first resin composition and the second resin composition may differ still also in average particle size of the filler contained therein. By increasing the average particle size of the filler, the resin composition may be improved in fluidity. Difference of the average particle size of the fillers respectively contained in the first resin composition and the second resin composition may be adjusted to 5 μm or larger, for example.

The first resin composition and the second resin composition may differ still also in species or ratio of source materials. The first resin composition and the second resin composition may differ typically in resin which composes the base, or in curing agent.

By using a high-fluidity resin composition, the bonding wires 106 may be prevented from flowing and falling down in the resin. On the other hand, by using a low-fluidity resin composition, post-curing shrinkage of the resin may generally be reduced, and thereby the warping may be made less likely to occur.

For example, in the configuration of this embodiment illustrated in FIG. 1, the high-fluidity resin composition may be adoptable to the first resin composition which composes the first resin region 112 having the bonding wires 106 filled therein, and the low-fluidity resin composition may be adoptable to the second resin composition which composes the second resin region 116. By burying the bonding wires 106 of the semiconductor chip 104 using the high-fluidity first resin composition, the bonding wires 106 may be prevented from flowing. On the other hand, by configuring the encapsulation resin 110 by encapsulation using the low-fluidity second resin composition, the warping of the semiconductor device 100 may be reduced.

Still alternatively, a resin optimized for laser marking, with a small average particle size of filler and a large carbon content, may be adoptable to the second resin composition which composes the second resin region 116 formed in the topmost portion of the encapsulation resin 110. By forming this sort of second resin composition in the topmost portion of the encapsulation resin 110, the semiconductor device 100 excellent also in the visibility of laser-marked letters may be obtained.

Since the warping behavior may be suppressed by varying the compositional ratio of the first resin composition and the second resin composition, a highly-reliable package structure causative of only a small degree of warping in the process of encapsulation, and a small degree of warping of package may be obtained, without preparing a large number of resin compositions. The compositional ratio of the first resin composition to the second resin composition herein may be set typically to 1:99 or larger and 99:1 or smaller, preferably 10:90 or larger and 90:10 or smaller. According to the adjustment, the semiconductor device 100 may successfully be controlled in the amount of warping.

Still alternatively, by making the mixed layer 114 reside between the first resin region 112 and the second resin region 116 in this embodiment, adhesiveness between the first resin region 112 and the second resin region 116 may be improved, and thereby separation therebetween may be prevented. Since the interface between the first resin region 112 and the mixed layer 114, and the interface between the second resin region 116 and the mixed layer 114 are not flat but have a wavy profile in this embodiment, so that the adhesiveness between the first resin region 112 and the mixed layer 114, and between the mixed layer 114 and the second resin region 116 may further be improved.

In this embodiment, the semiconductor chip 104 may be manufactured by using the first resin composition and the second resin composition in the process of encapsulation with the encapsulation resin 110, so that the encapsulation resin 110 contains the first resin region 112, the second resin region 116, and the mixed layer 114 formed between the first resin region 112 and the second resin region 116 so as to have the first resin composition and the second resin composition mixed therein. More specifically, in this embodiment, the encapsulation resin 110 may be formed by placing the first resin composition and the second resin composition on the substrate 102, while keeping their geometrical stability to a certain degree, and by allowing them to cure in a single process of curing. In this way, a region having both resin components mixed therein may be formed only at the boundary of both resin regions, rather than being formed over the entire thickness of the encapsulation resin 110. These procedures also allow the interface between the first resin region 112 and the mixed layer 114 and the interface between the second resin region 116 and the mixed layer 114 to have a wavy profile. By allowing the interface between the first resin region 112 and the mixed layer 114 and the interface between the second resin region 116 and the mixed layer 114 to have a wavy profile, or an irregularity, the adhesiveness may be improved. The procedures of manufacturing will be detailed later.

The thickness of the encapsulation resin 110 (mold thickness) may be adjusted typically to approximately 0.10 mm or larger and 1.20 mm or smaller, without special limitations. Based on the adjustment, an optimum package structure may be obtained.

FIGS. 2A to 2D, and FIGS. 3A to 3C are sectional views illustrating other examples of the semiconductor device 100 illustrated in FIG. 1. Examples illustrated herein are those varied in the compositional ratio of the first resin region 112 and the second resin region 116, and arrangement of the both.

Figure 2A:
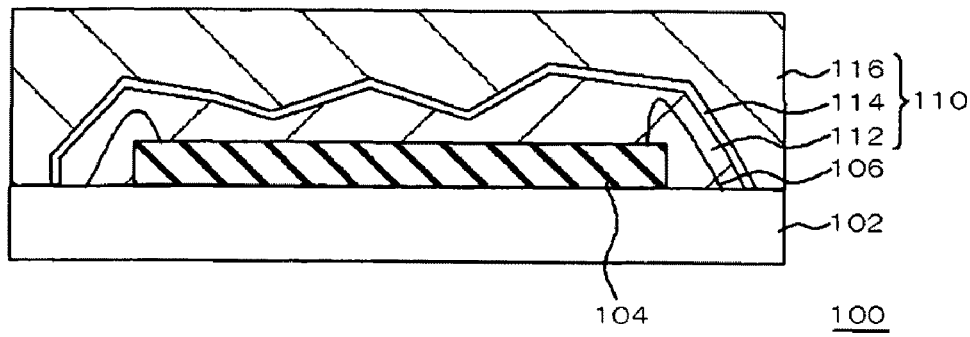
FIGS. 2A to 2D and FIGS. 3A to 3C are sectional views illustrating other exemplary configurations of a semiconductor device in one embodiment of the present invention.
Figure 14A:
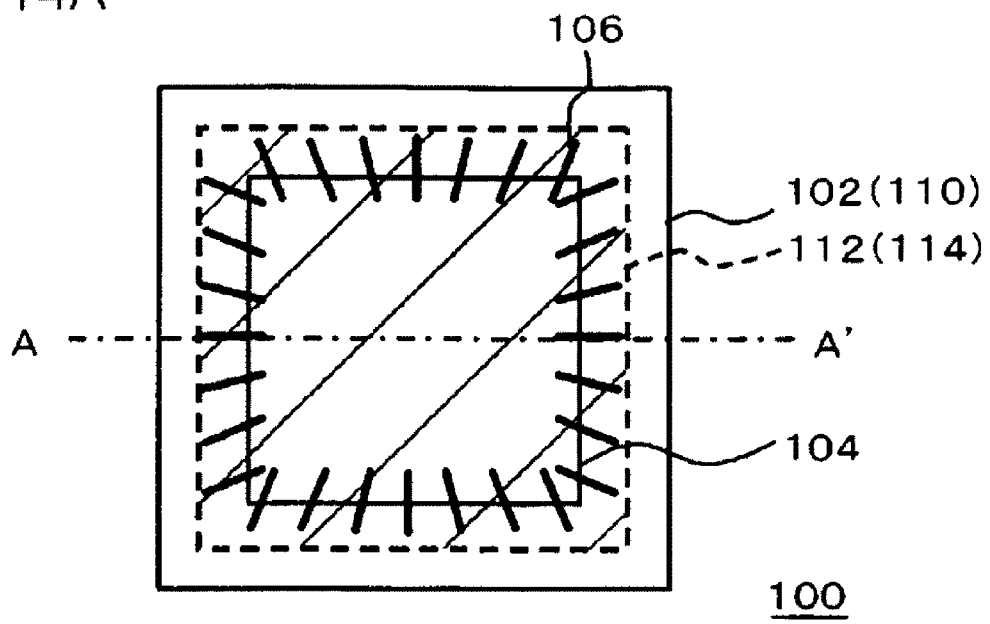

In the example illustrated in FIG. 2A, the ratio of the second resin region 116 is larger than that in the case illustrated in FIG. 1. The second resin region 116 herein is formed in contact with the substrate 102 at the end of the substrate 102. Also in this case, the first resin composition which composes the first resin region 112 may be highly fluidic. By virtue of this configuration, the flowing of wires may be moderated. A highly reliable package may be obtained by appropriately optimizing the ratio of the first resin region 112 and the second resin region 116. Also the thermal resistance of the package may be lowered by using a resin having a large thermal conductivity, for the second resin region 116. FIG. 14A is a plan view of the semiconductor device 100 illustrated in FIG. 2A. In the drawing, the individual constituents are simply outlined for easy understanding of the positional relations, with a hatching given only to an area where the first resin region 112 is formed. FIG. 2A corresponds to a sectional view taken along line A-A' in FIG. 14A.

Figure 2B:
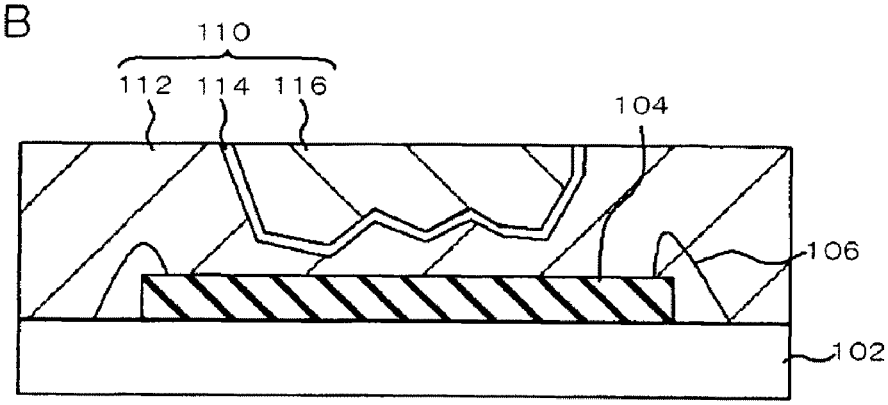
Figure 14B:
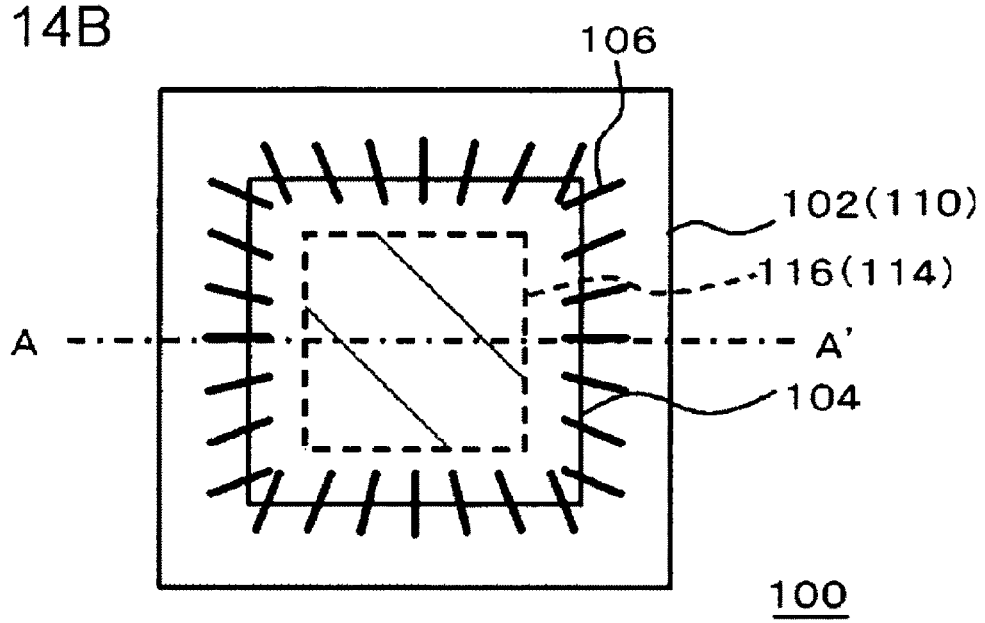

In the example illustrated in FIG. 2B, the ratio of the second resin region 116 is smaller than that in the case illustrated in FIG. 1. Also in this case, the first resin composition which composes the first resin region 112 may be highly fluidic. By virtue of this configuration, the height of wire bonding in the process of packaging may more readily be controlled, thereby the productivity may be improved, and the flowing of wires may be moderated. By appropriately optimizing the ratio of the first resin region 112 and the second resin region 116, a highly-reliable package may be obtained. FIG. 14B is a plan view of the semiconductor device 100 illustrated in FIG. 2B. In the drawing, the individual constituents are simply outlined for easy understanding of the positional relations, with a hatching given only to an area where the second resin region 116 is formed. FIG. 2B corresponds to a sectional view taken along line A-A' in FIG. 14B.

Figure 2C:
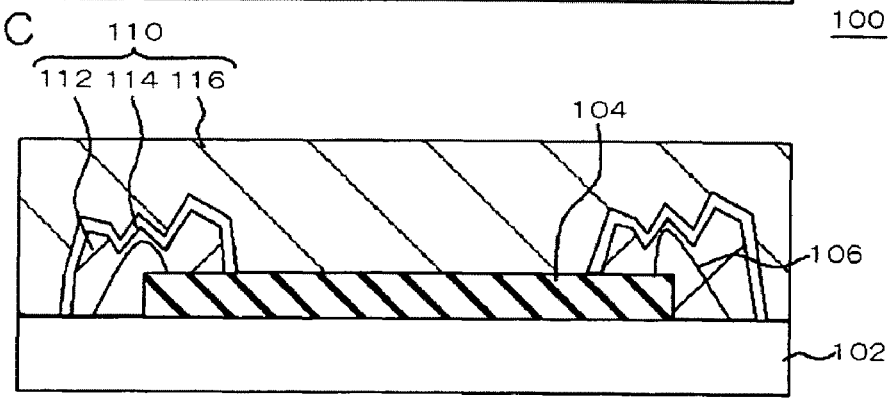
Figure 15A:
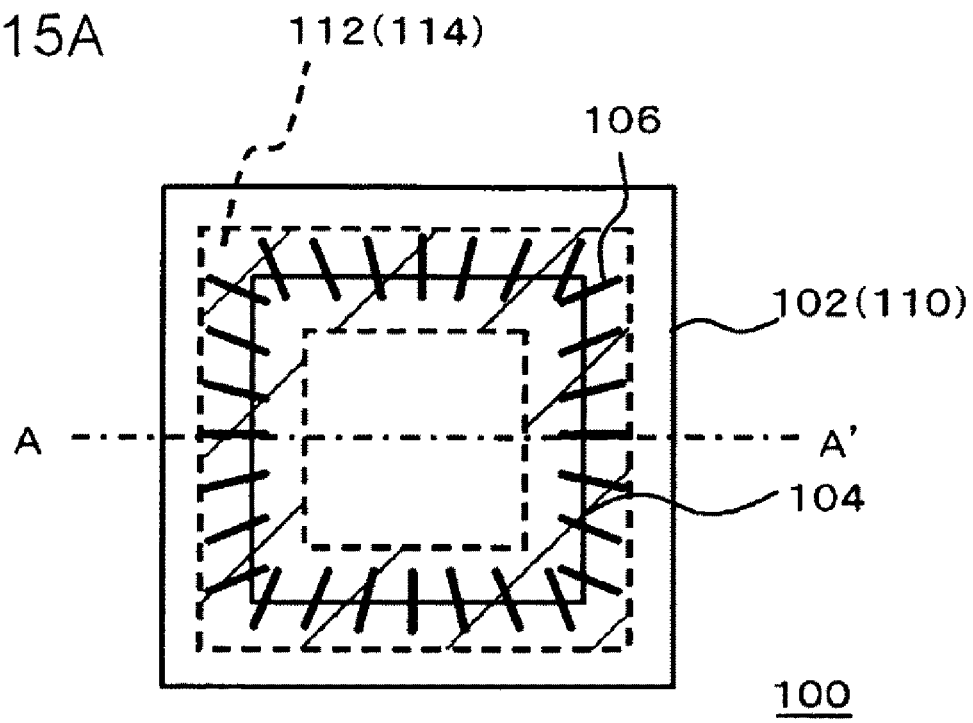

In the example illustrated in FIG. 2C, the first resin region 112 is selectively provided only to areas where the bonding wires 106 are buried. Also in this case, the first resin composition which composes the first resin region 112 may be highly fluidic. In this example, typically by using a material which shows a desired warping behavior as the second resin composition which composes the second resin region 116, the warping behavior of the semiconductor device 100 may be controlled based on the second resin composition which has a larger compositional ratio. Accordingly, the warping behavior of the semiconductor device 100 may desirably be controlled, while preventing the bonding wires 106 from flowing. FIG. 15A is a plan view of the semiconductor device 100 illustrated in FIG. 2C. In the drawing, the individual constituents are simply outlined for easy understanding of the positional relations, with a hatching given only to an area where the first resin region 112 is formed. FIG. 2C corresponds to a sectional view taken along line A-A' in FIG. 15A. Alternatively, for an exemplary case where the bonding wires 106 are provided only across a part of four edges of the semiconductor chip 104, or across the corner portions, the first resin region 112 may selectively be provided only to these portions.

Figure 2D:
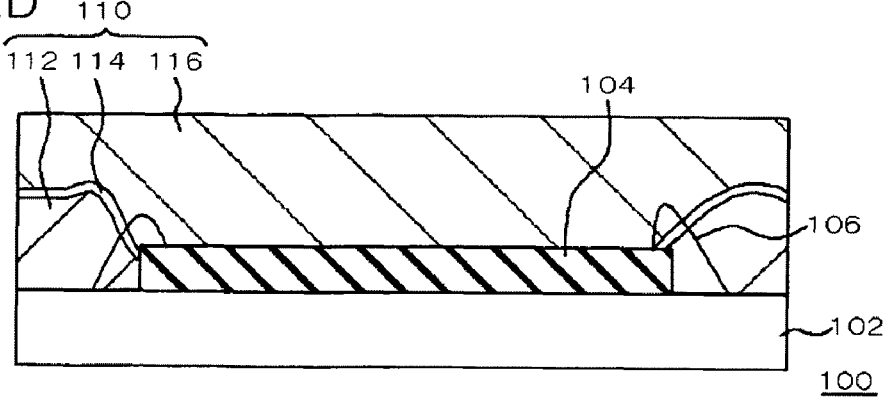
Figure 15B:
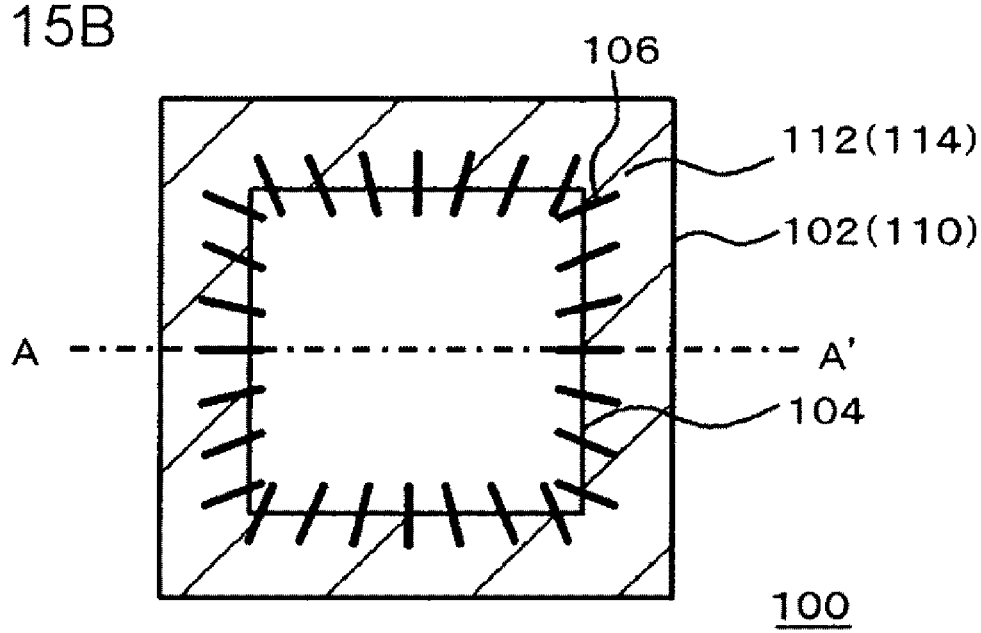

In the example illustrated in FIG. 2D, the first resin region 112 is selectively provided only to a part of area having the bonding wires 106 buried therein. Also in this case, the first resin composition which composes the first resin region 112 may be highly fluidic. By providing the highly-fluidic first resin region 112 at the area where the bonding wires 106 are connected to the substrate 102, the bonding wires 106 may be prevented from flowing. Also in this case, typically by using a material which shows a desired warping behavior as the second resin composition which composes the second resin region 116, the warping behavior of the semiconductor device 100 may be controlled based on the second resin composition which has a larger compositional ratio. Accordingly, the warping behavior of the semiconductor device 100 may desirably be controlled, while preventing the bonding wires 106 from flowing. FIG. 15B is a plan view of the semiconductor device 100 illustrated in FIG. 2D. In the drawing, the individual constituents are simply outlined for easy understanding of the positional relations, with a hatching given only to an area where the first resin region 112 is formed. FIG. 2D corresponds to a sectional view taken along line A-A' in FIG. 15B.

Figure 3A:
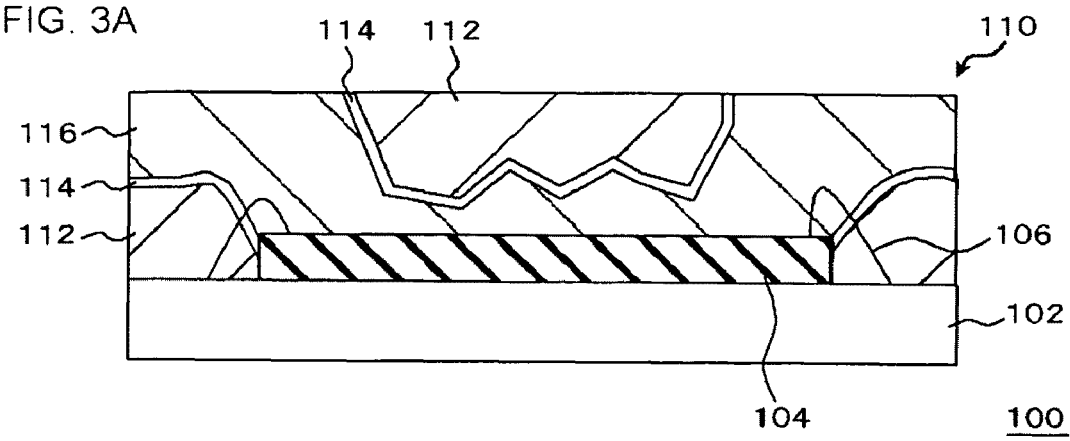

In the example illustrated in FIG. 3A, the first resin region 112 is selectively provided to a part of the area having the bonding wires 106 buried therein and an area being not brought into contact with the top surface of the body of the semiconductor chip 104. In this case, the second resin region 116 is formed over the entire range of the top surface of the semiconductor chip 104. Also in this case, the first resin composition which composes the first resin region 112 may be highly fluidic. By providing the highly-fluidic first resin region 112 to an area where the bonding wires 106 are connected to the substrate 102, the bonding wires 106 may be prevented from flowing.

Figure 3B:
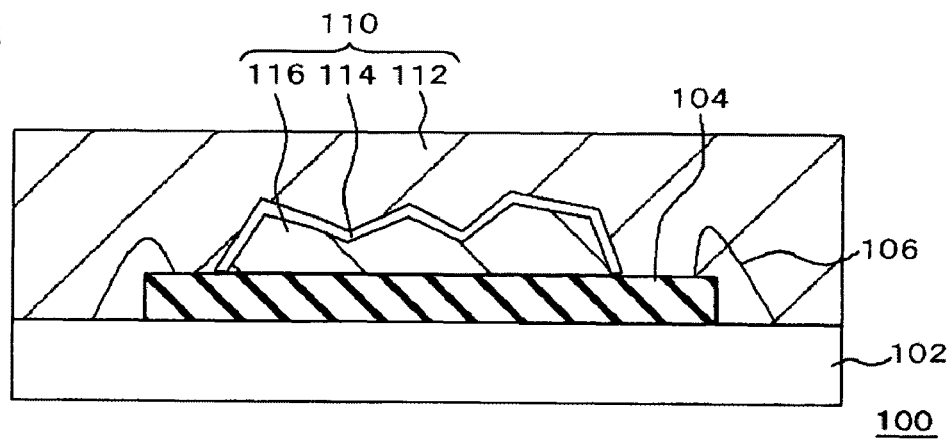

In the example illustrated in FIG. 3B, the second resin region 116 is provided only to a part of the area over the top surface of the body of the semiconductor chip 104. Also in this case, the first resin composition which composes the first resin region 112 may be highly fluidic. In this configuration, by using a low-stress resin for the second resin region 116, any mechanically weak portions of the semiconductor chip 104 may be protected, and thereby the reliability may be improved.

Figure 3C:
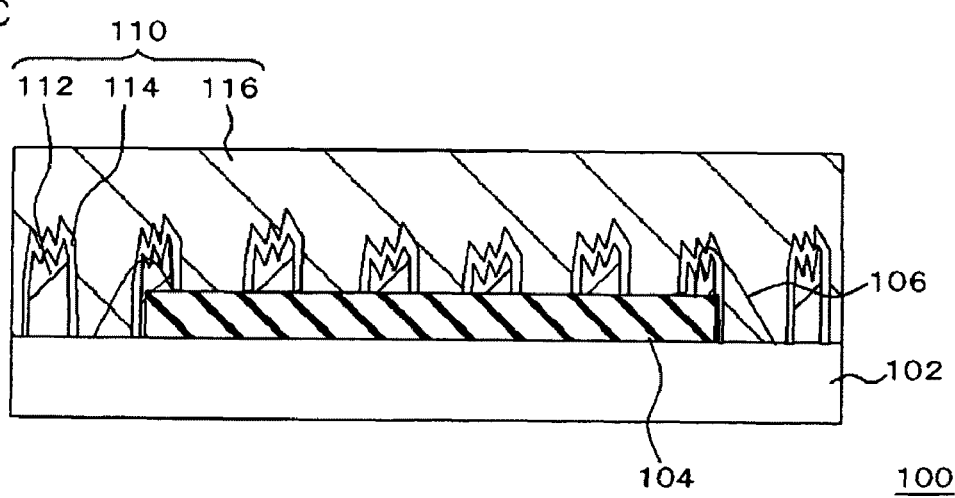
Figure 16:
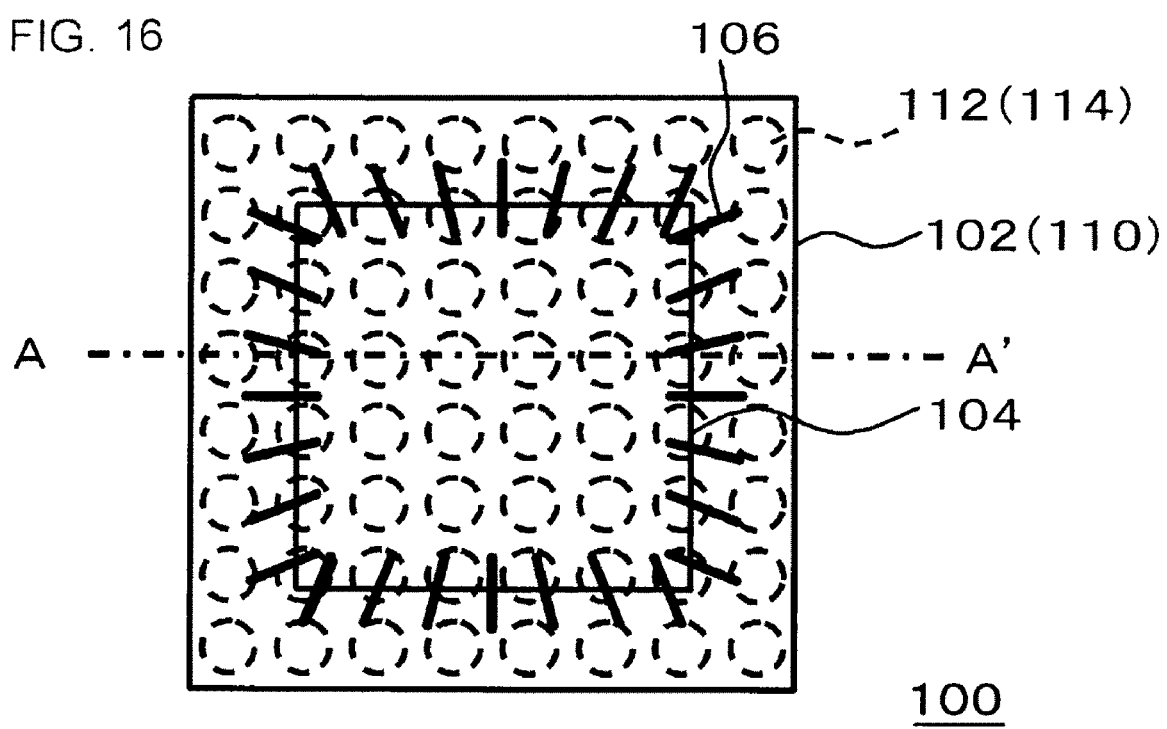

In the example illustrated in FIG. 3C, the first resin region 112 and the second resin region 116 are alternately arranged in the in-plane direction of the substrate 102. More specifically, the first resin region 112 and the second resin region 116 are alternately arranged to form a dot matrix pattern in a plan view, and the mixed layer 114 is formed at every interface therebetween. By virtue of this configuration, resistance against separation between the substrate 102 and the semiconductor chip 104 and crack resistance may be improved, and thereby a highly-reliable package may be obtained. FIG. 16 is a plan view of the semiconductor device 100 illustrated in FIG. 3C. In the drawing, the individual constituents are simply outlined for easy understanding of the positional relations, where only portions having the first resin region 112 formed therein are indicated by dashed lines. FIG. 3C corresponds to a sectional view taken along line A-A' in FIG. 16.

Figure 4A:
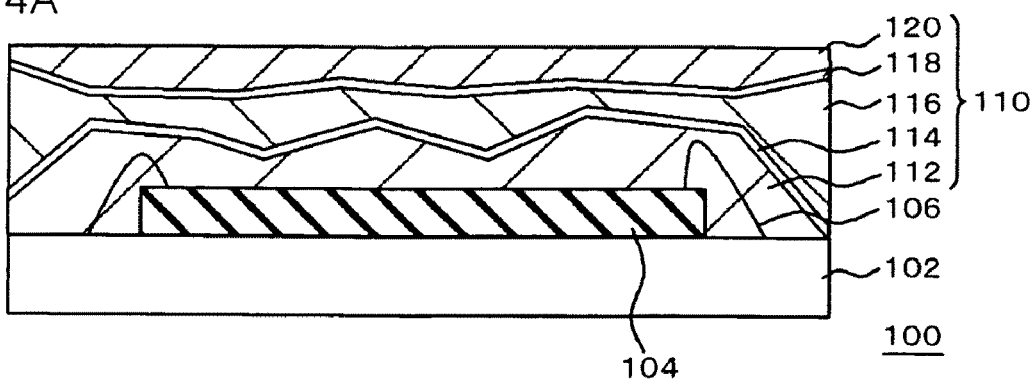
FIGS. 4A to 4B are sectional views illustrating still other exemplary configurations of a semiconductor device in one embodiment of the present invention.
Figure 4B:
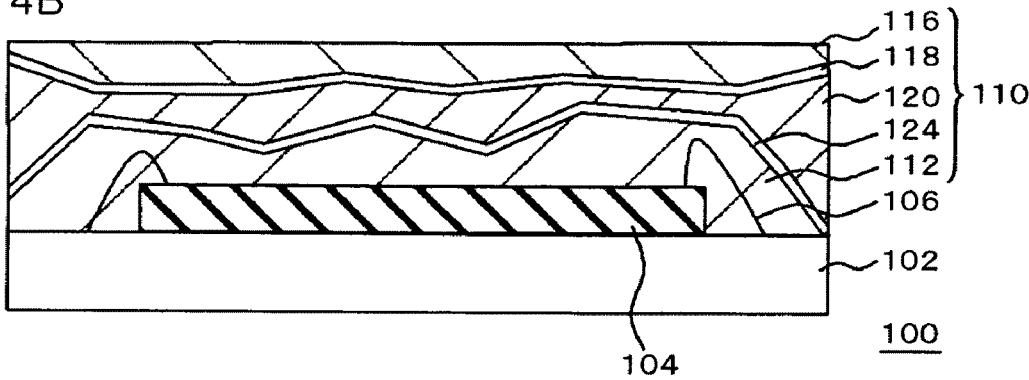

FIGS. 4A and 4B are sectional views illustrating still other examples of the semiconductor device 100 illustrated in FIG. 1. The encapsulation resin 110 herein is configured by a third resin region 120 which is composed of third resin composition, in addition to the first resin region 112 and the second resin region 116.

Also the third resin composition which composes the third resin region 120 may contain, as the source materials, resin which composes a base, hardener, and filler. The third resin composition may additionally contain, as the source materials, flexibility enhancer, curing accelerator, latent catalyst, mold releasing agent, silicone oil, stress reducing agent, colorant and so forth. The third resin composition which composes the third resin region 120 may be different from the first resin composition and the second resin composition, typically in the fluidity under heating in the process of encapsulation before curing. The third resin composition which composes the third resin region 120 may be different from the first resin composition and the second resin composition, also in the curing shrinkage characteristics. The third resin composition which composes the third resin region 120 may be different from the first resin composition and the second resin composition, still also in the glass transition temperature (Tg).

In the example illustrated in FIG. 4A, the first resin region 112 is formed over the entire surface of the substrate 102, and the second resin region 116 is formed over the first resin region 112. Further on the second resin region 116, the third resin region 120 is formed. At the boundary region between the first resin region 112 and the second resin region 116, the mixed layer 114 is formed over the entire range. At the boundary region between the second resin region 116 and the third resin region 120, a mixed layer 118 having the second resin composition and the third resin composition mixed therein is formed over the entire range. The body of the semiconductor chip 104 and the bonding wires 106 are buried in the first resin region 112. Also in this case, the first resin composition which composes the first resin region 112 may be highly fluidic. Still alternatively, a resin optimized for laser marking, with a small average particle size of filler and a large carbon content, may be adoptable to the third resin composition which composes the third resin region 120. By forming this sort of third resin composition in the topmost portion of the encapsulation resin 110, the semiconductor device 100 excellent also in the visibility of laser-marked letters may be obtained.

Alternatively, as illustrated in FIG. 4B, location of the second resin region 116 and the third resin region 120 may be exchanged. Also in this case, a mixed layer 124 having the first resin composition and the third resin composition mixed therein is formed at the boundary region of the first resin region 112 and the third resin region 120. Also at the boundary region between the third resin region 120 and the second resin region 116, the mixed layer 118 having the third resin composition and the second resin composition mixed therein is formed.

Figure 5:
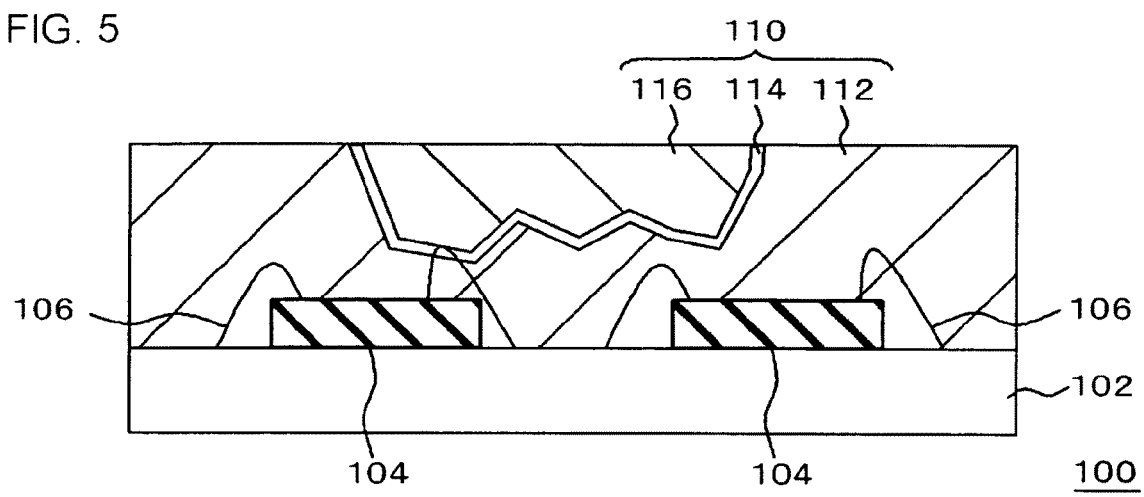
FIG. 5 is a sectional view illustrating another exemplary configuration of a semiconductor device in one embodiment of the present invention.

FIG. 5 is a sectional view of the semiconductor device 100 configured to have a plurality of semiconductor chips 104 mounted side by side on the substrate 102. Also in this case having a plurality of semiconductor chips 104 mounted therein, they may be encapsulated by the encapsulation resin 110 configured similarly to as described referring to FIG. 1 to FIG. 4B. Alternatively, only either one of these semiconductor chips 104 may be buried in one of the resin regions. For example, one of two semiconductor chips is configured to have the bonding wires 106 as illustrated in the above, the other may be configured to have no bonding wires 106 but to allow flip chip bonding, and only the semiconductor chip having the bonding wires 106 may be buried by a highly-fluidic resin composition. The configuration, illustrated herein so as to have two semiconductor chips placed side by side on the substrate 102, may alternatively have a plurality of semiconductor chips stacked with each other. The semiconductor chips 104, illustrated herein so as to be bonded by the bonding wires 106, may alternatively be configured in various ways, such as being bonded by flip-chip bonding and so forth.

Next, procedures of manufacturing of the semiconductor device 100 in this embodiment will be explained.

In this embodiment, the encapsulation resin 110 of the semiconductor device 100 may be formed typically by compression molding process, transfer molding process, potting process, printing process, or the like.

(Compression Molding Process)

FIGS. 6A to 6D are sectional views illustrating procedures of manufacturing of a semiconductor device 100 using a compression molding machine 300.

Figure 6A:
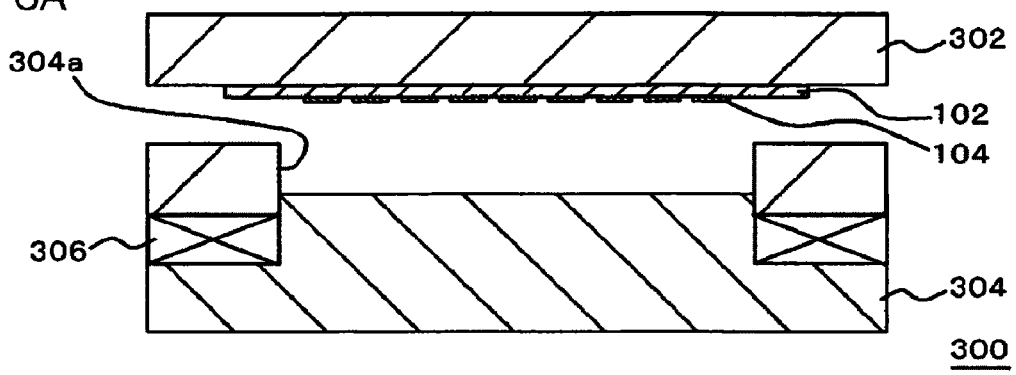
FIGS. 6A to 6D are sectional views illustrating procedures of manufacturing of a semiconductor device using a compression molding machine in one embodiment of the present invention.
Figure 6B:
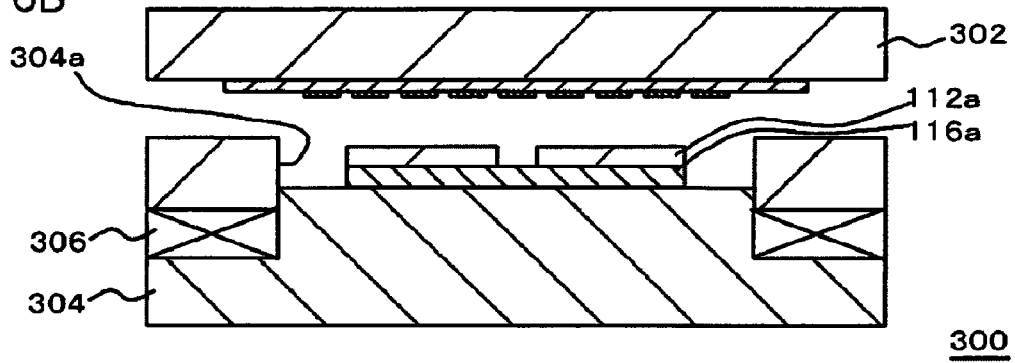

The compression molding machine 300 includes an upper die 304 which has a cavity 304a in which the resin compositions are disposed, and a lower die 302. Springs 306 are attached between the outer circumferential wall of the cavity 304a and the body of the upper die 304. In thus-configured compression molding machine 300, the substrate 102 is attached to the lower die 302, so as to oppose the semiconductor chip 104 mounted on the substrate 102 with the upper die 304 (FIG. 6A). Next, the resin compositions are set to the cavity 304a. Geometry of the resin compositions may be arbitrary, but may be designed so as to keep a certain degree of stability, so as to avoid mixing of the plurality of resin compositions in the process of curing. In this embodiment, the resin compositions may be given in a form of preform. Each preform may be an object obtained by mixing and kneading source materials of the resin composition, cooling and crushing the resultant clay-like resin, placing the obtained granular resin into a specified container, and heating the granular resin at low temperatures so as to obtain a flat plate resin (semi-cured product). FIG. 6B illustrates an exemplary case where a first preform 112a composed of the first resin composition and second preforms 116a composed of the second resin composition are set in the cavity 304a in a stacked manner. Alternatively, in place of using the preforms, any granular resins before being made into preforms, or resin compositions before being cured and derived from the granular resins molded into a form of tablet, may be subjected to compression molding.

Figure 6C:
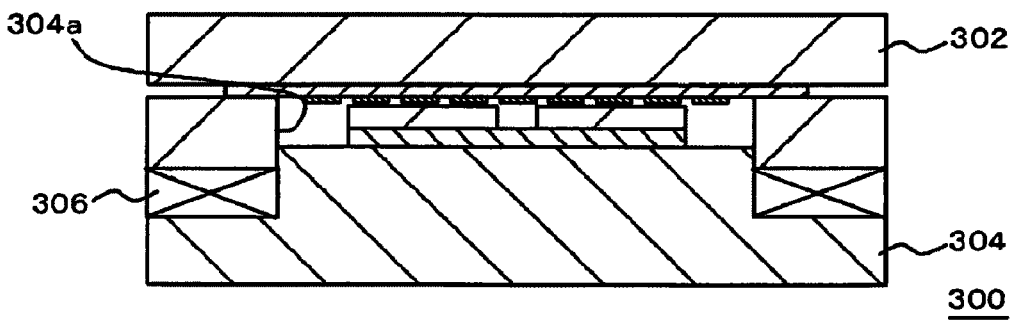
Figure 6D:
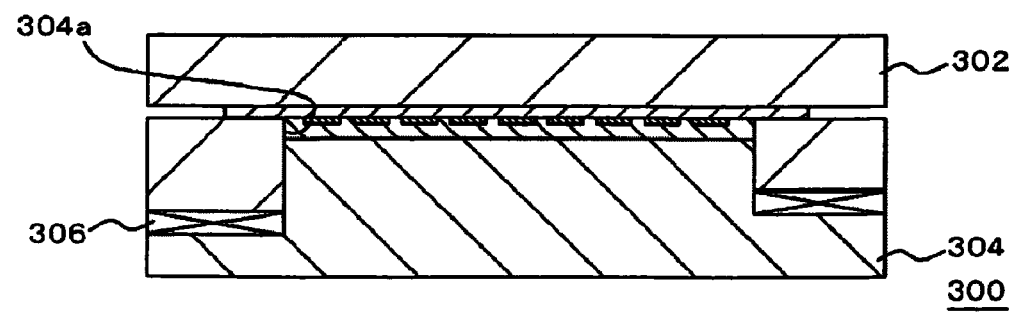

In this configuration, the compression molding is carried out by pressing the lower die 302 against the outer circumferential wall of the cavity 304a under heating, thereby the outer circumferential wall of the cavity 304a moves towards the body of the upper die 304, and the cavity 304a is shallowed. Accordingly, the first preform 112a and the second preform 116a set in the cavity 304a are melted and cured, and thereby the encapsulation resin 110 is formed (FIG. 6C, FIG. 6D).

FIGS. 7A to FIG. 9B are sectional views illustrating procedures of manufacturing of the semiconductor device 100.

Figure 7A:
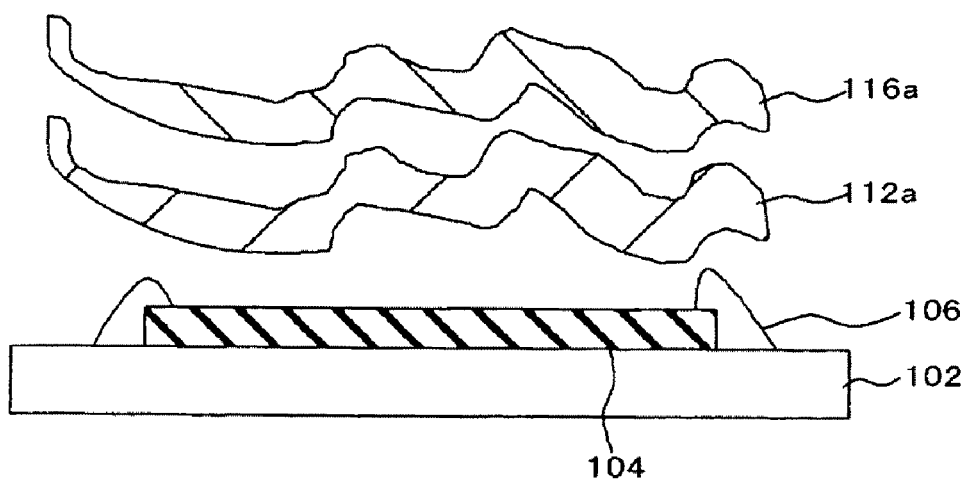
FIGS. 7A and 7B, FIGS. 8A and 8B, and FIGS. 9A and 9B are sectional views illustrating other procedures of manufacturing a semiconductor device by compression molding process in the embodiment of the present invention.
Figure 7B:
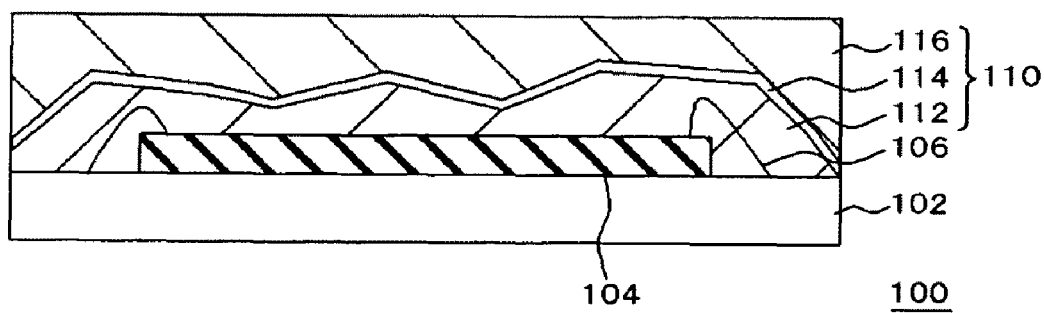

In the example illustrated in FIG. 7A, the first preform 112a and the second preform 116a are placed in this order over the semiconductor chip 104 and the bonding wires 106 on the substrate 102. The first preform 112a and the second preform 116a herein may have geometries of almost equal width (FIG. 7A). As a consequence, the semiconductor device 100 configured similarly to as illustrated in FIG. 1 may be obtained (FIG. 7B).

In this embodiment, by allowing the first preform 112a and the second preform 116a to cure at the same time while keeping them in a stacked state, the mixed layer 114 is formed between the first resin region 112 and the second resin region 116, so as to give a wavy profile to the interfaces of the mixed layer 114 with both of the first resin region 112 and the second resin region 116.

In this embodiment, by disposing the preforms depending on the geometries of the individual resin regions of the encapsulation resin 110 to be aimed at, a desired layout of the resin regions may be achieved.

Figure 8A:
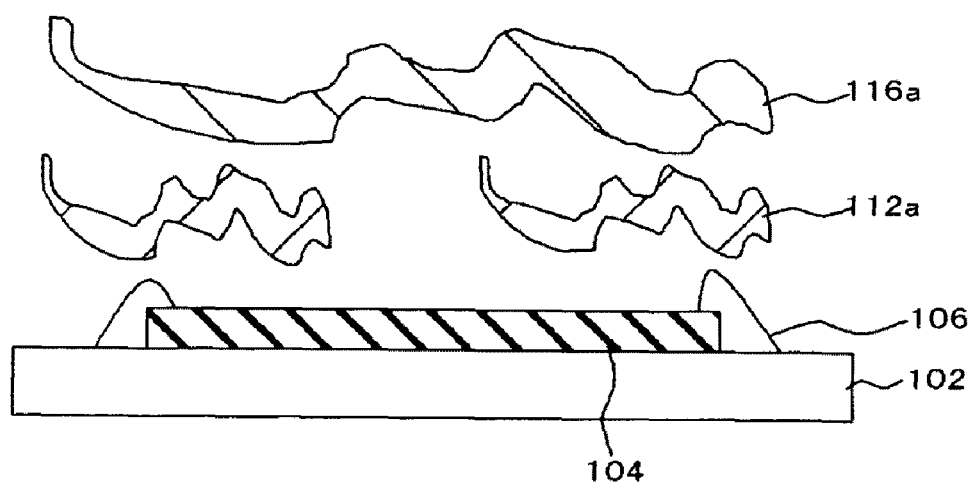
Figure 8B:
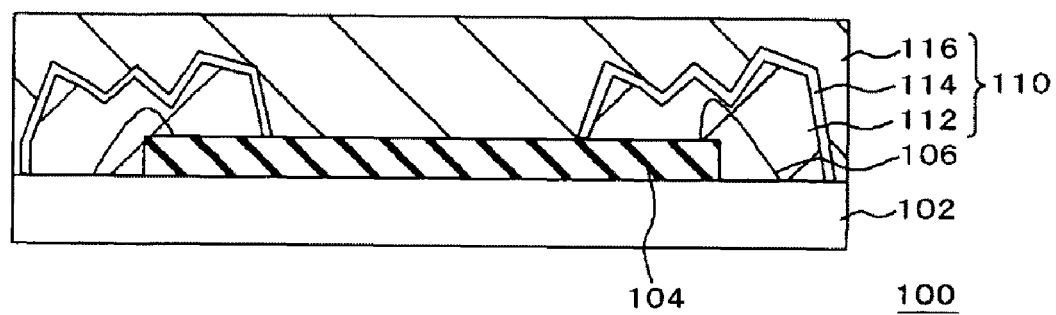

In the examples illustrated in FIGS. 8A and 8B, the compression molding is carried out after disposing, over the semiconductor chip 104 and the bonding wires 106 on the substrate 102, two first preforms 112a side by side so as to be corresponded to the positions of the bonding wires 106, and then disposing thereon the second preform 116a. Each of the first preform 112a may have a width narrower that that of the second preform 116a (FIG. 8A). As a consequence, the semiconductor device 100 configured similarly to as illustrated in FIG. 2C may be obtained (FIG. 8B).

Figure 9A:
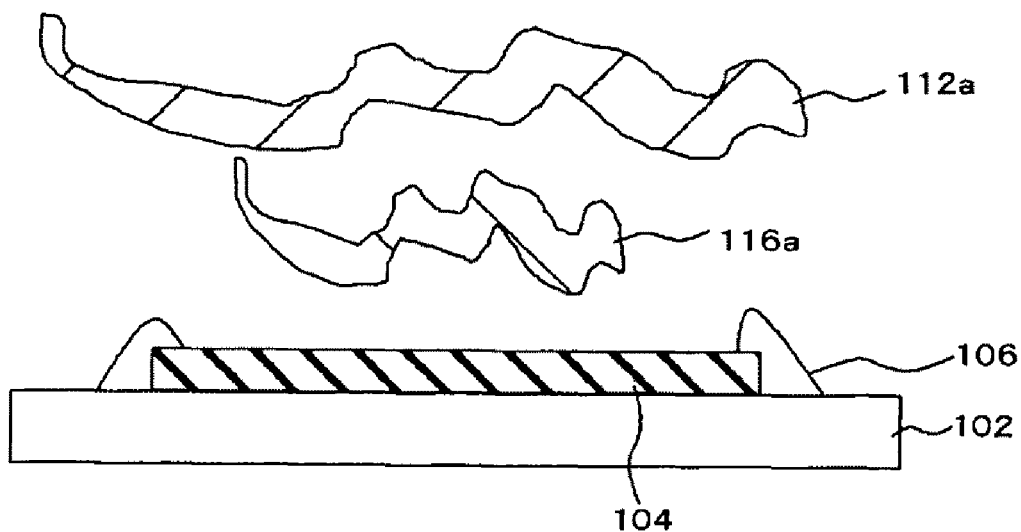
Figure 9B:
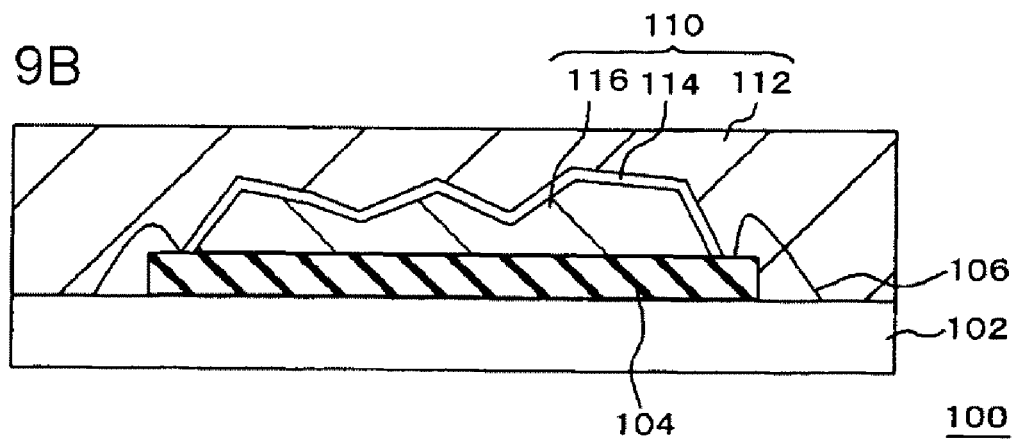

In the examples illustrated in FIGS. 9A and 9B, the compression molding is carried out after disposing the second preform 116a and the first preform 112a in this order over the semiconductor chip 104 and the bonding wire 106 on the substrate 102. The second preform 116a herein may have a width narrower than that of the first preform 112a (FIG. 9A). As a consequence, the semiconductor device 100 configured similarly to as illustrated in FIG. 3B may be obtained (FIG. 9B).

(Transfer Molding Process)

In this embodiment, the transfer molding process may be a top feeding process by which the resin compositions are fed from the top of a die.

Figure 10A:
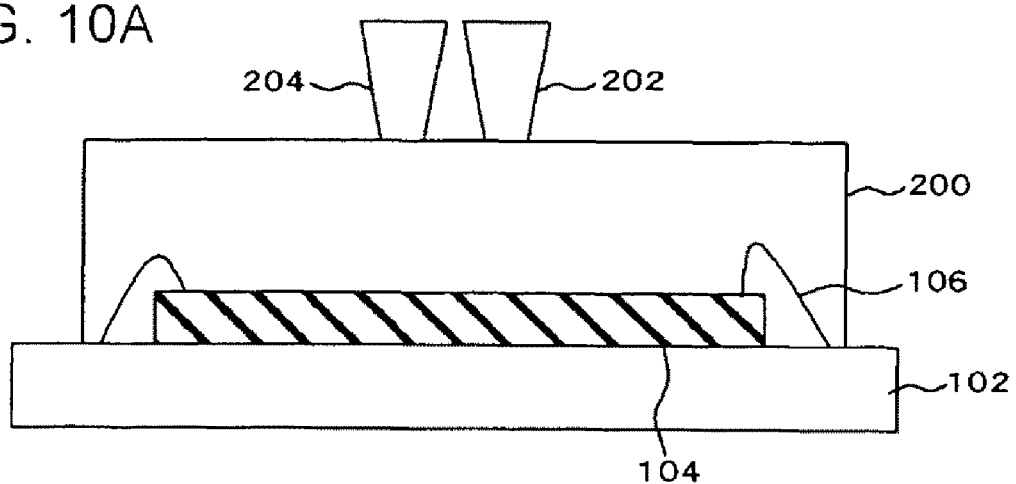
FIGS. 10A and 10B, and FIGS. 11A and 11B are sectional views illustrating procedures of manufacturing a semiconductor device using dies for transfer molding.
Figure 10B:
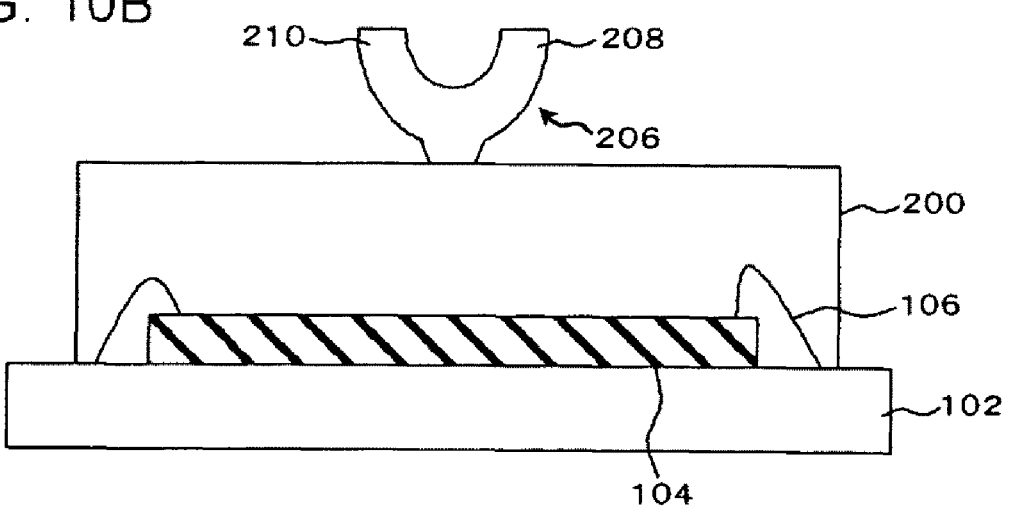

FIGS. 10A and 10B are sectional views illustrating procedures of manufacturing of the semiconductor device 100 using a die 200 for transfer molding. In the example illustrated in FIG. 10A, the die 200 is provided with a plurality of nozzles, which are a first nozzle 202 and a second nozzle 204. By using thus-configured die 200, the first resin composition is introduced typically through the first nozzle 202 into the die 200, and the second resin composition is introduced typically through the second nozzle 204 into the die 200 at a certain time lag. The resin composition to be introduced later herein is introduced before the precedently-introduced resin composition begins to cure, so that two resin compositions are formed by a single process of curing. Accordingly, the encapsulation resin 110 which is composed of the first resin region 112, the mixed layer 114, and the second resin region 116 may be formed.

In the example illustrated in FIG. 10B, the die 200 is provided with a feed port 206 which contains a first feed port 208 and a second feed port 210. By using thus-configured die 200, the first resin composition is introduced typically through the first feed port 208 into the die 200, and the second resin composition is introduced through the second feed port 210 into the die 200 at a certain time lag. The resin composition to be introduced later herein is introduced before the precedently-introduced resin composition begins to cure, so that two resin compositions are formed by a single process of curing. Accordingly, the encapsulation resin 110 which is composed of the first resin region 112, the mixed layer 114, and the second resin region 116 may be formed.

Figure 11A:
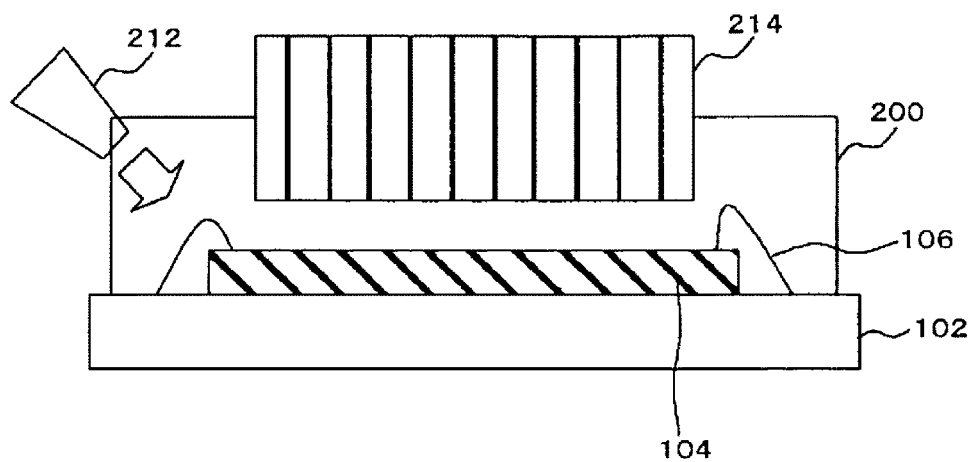
Figure 11B:
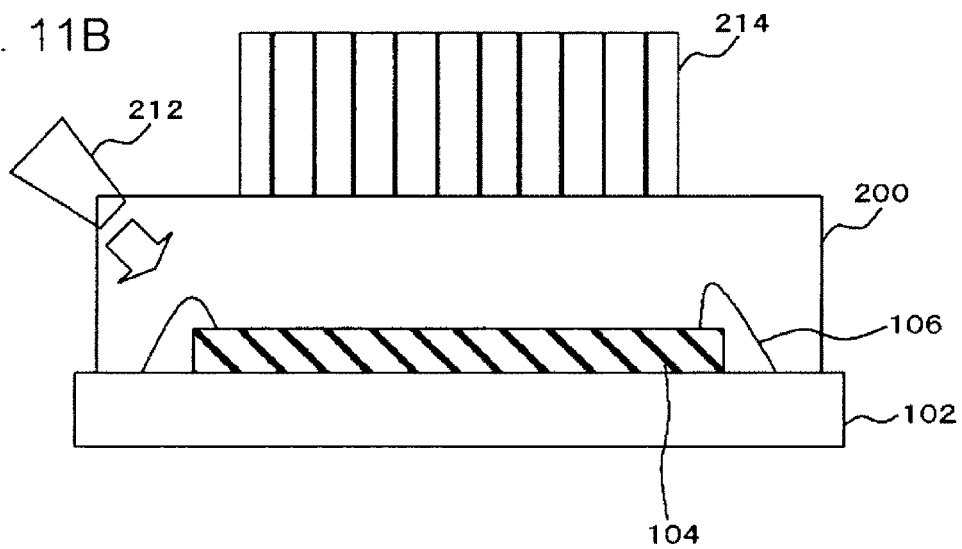

Examples illustrated in FIGS. 11A and 11B further adopt a presser die 214 in addition to the die 200 for transfer molding. The die 200 is provided with a feed port 212. The feed port 212 may alternatively be configured so as to allow separate feeding of the first resin composition and the second resin composition, as illustrated in FIGS. 10A and 10B. First, the presser die 214 is preliminarily inserted into the die 200, so as to narrow the inner space of the die 200, and to thereby give a predetermined space geometry. In this state, the first resin composition, for example, is fed through the feed port 212 into the die 200. Thereafter, the presser die 214 is moved upward so as to widen the inner space of the die 200, and the second resin composition, for example, is then fed through the feed port 212 into the die 200. By these procedures, the geometry of the precedently introduced resin composition may be controlled by the presser die 214, and the semiconductor device 100 having a desired layout of resin regions may be formed. Also in this case, the resin composition to be introduced later is introduced before the precedently-introduced resin composition begins to cure, so that two resin compositions are formed by a single process of curing. Accordingly, the encapsulation resin 110 which is composed of the first resin region 112, the mixed layer 114, and the second resin region 116 may be formed. In addition, the interface between the first resin region 112 and the mixed layer 114, and the interface between the second resin region 116 and the mixed layer 114 may have a wavy profile.

Figure 12:
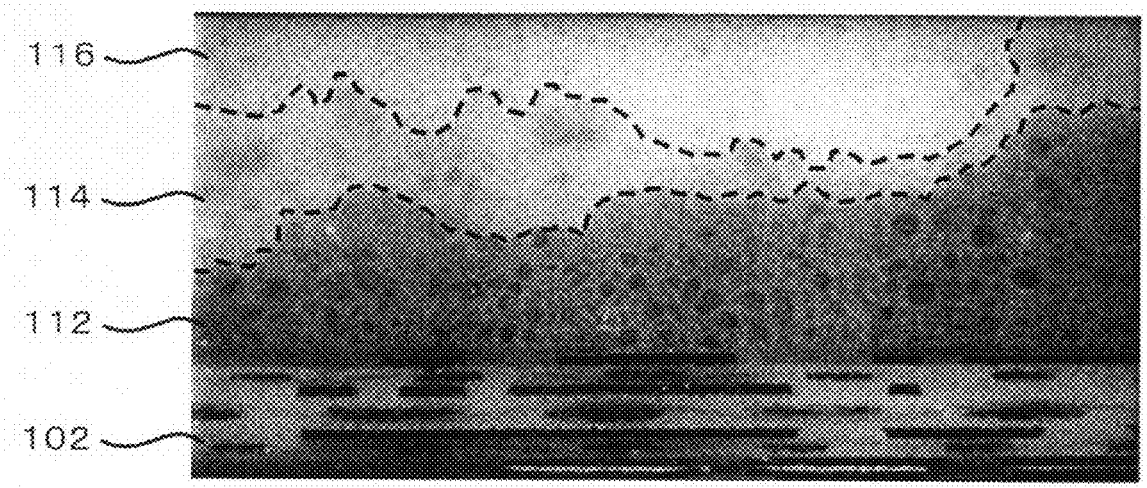
FIG. 12 is a drawing illustrating a configuration of a cross section of a semiconductor device observed under a metallurgical microscope in one embodiment of the present invention.

FIG. 12 is a drawing illustrating a configuration of a cross section of a semiconductor device 100 of this embodiment observed under a metallurgical microscope. The semiconductor device 100 herein was formed by compression molding process, using the compression molding machine 300 configured similarly to as illustrated in FIGS. 6A to 6D. In order to confirm the state of mixing of the resin compositions, the first resin composition was preliminarily tinted with a blue ink, and the second resin composition with a yellow ink. It is found that the mixed layer 114 was formed between the first resin region 112 and the second resin region 116. The interface between the first resin region 112 and the mixed layer 114, and the interface between the second resin region 116 and the mixed layer 114 are configured to have wavy profiles.

According to the above-described configurations, the semiconductor chip may be encapsulated by using a plurality of resin compositions which are selected depending on purposes, and the mixed layer is formed between the every adjacent resin regions, so that every-adjacent resin regions may be improved in adhesiveness, and may successfully be prevented from separating. For example, by using a highly-fluidic resin composition aimed at moderating the flowing of the wires, and a poorly-fluidic resin composition aimed at suppressing the warping behavior in the process of encapsulating the semiconductor chip, both contradictory characteristics may fully be exhibited. As a consequence, the semiconductor device excellent in the mass productivity and reliability, which could not have been achieved by a single species of resin composition, may be obtained. Also the characteristics including the warping behavior of the semiconductor device containing the encapsulation resin may be improved. The warping behavior may be controlled by the compositional ratio of the first resin composition and the second resin composition. Accordingly, a highly-reliable package structure causative of only a small degree of warping in the process of encapsulation, and a small degree of warping of package may be obtained, without preparing or developing a large number of resin compositions.

The embodiments of the present invention have been described in the above referring to the attached drawings, merely as examples of the present invention, without being precluded from adoption of any other various configurations.

It is apparent that the present invention is not limited to the above embodiments, that may be modified and changed without departing from the scope and spirit of the invention.

What is claimed is:

1. A semiconductor device comprising:
   a substrate;
   a semiconductor chip mounted over said substrate; and
   an encapsulation resin encapsulating said semiconductor chip,
   wherein said encapsulation resin contains a first resin region composed of a first resin composition, a second resin region composed of a second resin composition, and a mixed layer formed between said first resin region and said second resin region so as to have said first resin composition and said second resin composition mixed therein.

2. The semiconductor device as claimed in claim 1,
   wherein each of the interface between said first resin region and said mixed layer and the interface between said second resin region and said mixed layer have a wavy profile.

3. The semiconductor device as claimed in claim 1,
   wherein said first resin composition and said second resin composition differ in fluidity in the process of encapsulation.

4. The semiconductor device as claimed in claim 1,
   wherein said first resin composition and said second resin composition differ in content (weight by %) of a filler relative to the respective total resin composition.

5. The semiconductor device as claimed in claim 1,
   wherein said first resin composition and said second resin composition differ in species or ratio of source materials.

6. A method of manufacturing semiconductor device comprising encapsulating a semiconductor chip mounted over a substrate using an encapsulation resin,
   wherein in said encapsulating the semiconductor chip, the encapsulation is allowed to proceed using a first resin composition and a second resin composition so that said encapsulation resin contains a first resin region composed of said first resin composition, a second resin region composed of said second resin composition, and a mixed layer formed between said first resin region and said second resin region so as to have said first resin composition and said second resin composition mixed therein.

7. The method manufacturing a semiconductor device as claimed in claim 6,
   wherein the step of said encapsulating the semiconductor chip includes a process of subjecting a first preform composed of said first resin composition and a second preform composed of said second resin to composition compression molding at the same time.

8. The method manufacturing a semiconductor device as claimed in claim 6,
   wherein said encapsulating the semiconductor chip includes a process of subjecting said first resin composition before being cured and said second resin composition before being cured to compression molding at the same time.

* * * * *